United States Patent [19]

Ohtani et al.

[11] Patent Number: 4,697,112
[45] Date of Patent: Sep. 29, 1987

[54] CURRENT-MIRROR TYPE SENSE AMPLIFIER

[75] Inventors: Takayuki Ohtani, Tokyo; Mitsuo Isobe, Yokohama; Akira Aono, Yokohama; Nobuaki Urakawa, Yokohama, all of Japan

[73] Assignee: Kabushiki Kaisha Toshiba, Kawasaki, Japan

[21] Appl. No.: 878,372

[22] Filed: Jun. 25, 1986

[30] Foreign Application Priority Data

Feb. 20, 1986 [JP] Japan .................................. 61-35478

[51] Int. Cl.[4] ............................................. H03F 3/45
[52] U.S. Cl. ................................... 307/530; 307/496; 307/355; 365/205; 365/208
[58] Field of Search ................. 307/530, 355, 451–452, 307/496; 365/190, 203, 205, 207, 208; 330/257, 288

[56] References Cited

U.S. PATENT DOCUMENTS

| | | | |
|---|---|---|---|
| 4,136,292 | 1/1979 | Suzuki et al. | 365/208 X |
| 4,461,965 | 7/1984 | Chin | 307/530 |
| 4,479,202 | 10/1984 | Uchida | 307/530 X |
| 4,494,020 | 1/1985 | Konishi | 307/530 |
| 4,511,810 | 4/1985 | Yukawa | 307/530 X |
| 4,551,641 | 11/1985 | Pelley, III | 307/530 |
| 4,567,389 | 1/1986 | Tran | 307/530 |
| 4,611,130 | 9/1986 | Swanson | 307/355 |

OTHER PUBLICATIONS

Marzin et al., "Parity Check Circuit Arrangement for Random-Access Memory Array"; IBM-TDB, vol. 18, No. 5, pp. 1411-1412; 10/1975.
Minato et al., "A 20ns 64K CMOS SRAM," IEEE International Solid-State Circuits Conference, ISSCC, pp. 222-223 & 343, Feb. 23, 1984.

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

There is disclosed a sense amplifier characterized by comprising a pull-up circuit. The pull-up circuit comprises a first transistor arranged between the first of a pair of output nodes and a pull-up power source potential node, and a second transistor arranged between the second of the pair of output nodes and the pull-up power source potential node. The gate of the first transistor is connected to the second output node and the gate of the second transistor is connected to the first output node.

5 Claims, 6 Drawing Figures

F I G. 4
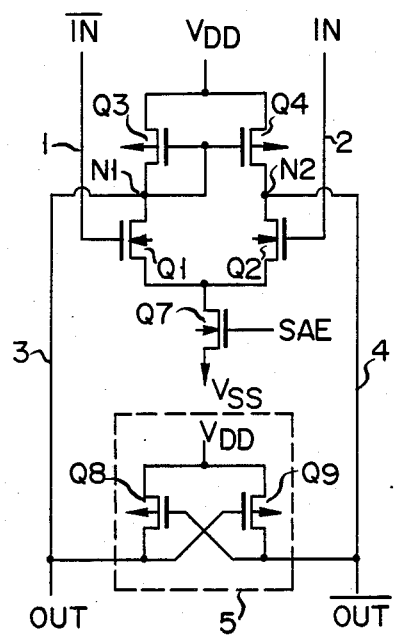
F I G. 5
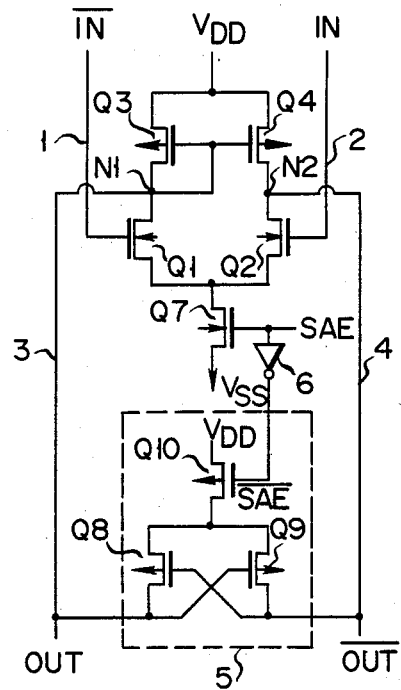
F I G. 6
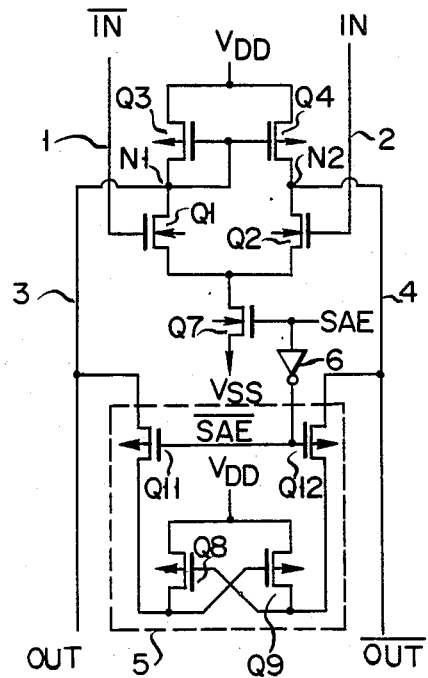

CURRENT-MIRROR TYPE SENSE AMPLIFIER

BACKGROUND OF THE INVENTION

The present invention relates to a sense amplifier and, more particularly, to a current-mirror type sense amplifier.

A differential amplifier type CMOS (Complementary Metal Oxide Semiconductor) sense amplifier using a current-mirror circuit as a load has been used in a conventional CMOS static RAM (Random Access Memory) or a conventional nonvolatile ROM (Read Only Memory) to detect data. Typical conventional sense amplifiers are exemplified in FIGS. 1 to 3.

In the conventional circuit of FIG. 1, transistors Q1 and Q2 are N channel MOS transistors constituting a differential amplifier, and transistors Q3 and Q4 are P channel MOS transistors constituting a current-mirror circuit as a load. Complementary differential input signals $\overline{IN}$ and IN are input to the gates of transistors Q1 and Q2, respectively. Complementary output signals OUT and $\overline{OUT}$ appear at junction N1 between transistors Q1 and Q3, and at junction N2 between transistors Q2 and Q4, respectively.

In the sense amplifier of FIG. 1, when input signals $\overline{IN}$ and IN are input through input signal lines 1 and 2, complementary output signals OUT and $\overline{OUT}$ amplified by the differential amplifier appear on output signal lines 3 and 4. If the voltage of input signal $\overline{IN}$ is lower than that of input signal IN, output signal OUT becomes high potential VOH and output signal $\overline{OUT}$ becomes low potential VOL. As the gate and drain of transistor Q3 are interconnected, high potential VOH is increased to only (VDD−|VTHP|), where VTHP is the threshold voltage of transistor Q3. Low potential VOL is determined by a ratio of the conductance of transistor Q4 to that of transistor Q2. Because of this, potential difference (VOH−VOL) does not exceed (VDD−|VTHP|−VOL). Therefore, the output amplitude of the sense amplifier becomes relatively low and the operation margin of the resultant memory is small.

In the conventional circuit of FIG. 2, transistors Q5 and Q6 are inserted between transistors Q3 and Q1 and between transistors Q4 and Q2, respectively. An enable signal (SAE) is supplied to the gates of transistors Q5 and Q6 to enable sensing of the sense amplifier. In the conventional circuit of FIG. 3, N channel switching transistor Q7 is inserted between transistors Q1 and Q2 and low power source potential VSS. An enable signal (SAE) is supplied to the gate of transistor Q7 to enable sensing of the sense amplifier.

In the circuits of FIGS. 2 and 3, the gate and drain of transistor Q3 are interconnected in the same manner as in FIG. 1, and high potential VOH is increased to only (VDD−|VTHP|). Therefore, output voltage (VOH−VOL) also does not exceed (VDD−|VTHP|−VOL). In the same manner as in the conventional arrangement of FIG. 1, the output amplitude of the sense amplifier is low, and the memory operation margins for variations in power source potential and characteristics of the transistors are inevitably small.

SUMMARY OF THE INVENTION

The present invention has been made in consideration of the above situation, and has as its object to provide a current-mirror type sense amplifier having a high output amplitude and a large memory operation margin.

According to the invention, there is provided a current-mirror type sense amplifier comprising: a pair of first and second input means, a pair of first and second output means, a first power source node connected to a power source potential, a second power source node connected to a power source potential, a pull-up node connected to a pull-up potential, a differential amplifier comprising first and second MOS transistors of a first conductivity type, the gate of said first transistor being connected to said first input means, the gate of said second transistor being connected to said second input means, and one terminal of the drain-source path of said first transistor being connected to said first output means, one terminal of the drain-source path of said second transistor being connected to said second output means, the other terminals of the drain-source path of said first and second transistors being connected to said second power source node, a current-mirror type load circuit comprising third and fourth MOS transistors of a second conductivity type, the drain-source path of said third transistor being connected between said first power source node and the other terminal of the drain-source path of said first transistor, the drain-source path of said fourth transistor being connected between said first power source node and the other terminal of the drain-source path of said second transistor, and the gates of said third and fourth transistors being interconnected, and a pull-up circuit comprising fifth and sixth MOS transistors of said second conductivity type, the drain-source path of said fifth transistor being connected between said pull-up node and said first output means, and the drain-source path of said sixth transistor being connected between said pull-up node and said second output means, the gate of said fifth transistor being connected to said second output means, and the gate of said sixth transistor being connected to said first output means.

BRIEF DESCRIPTION OF THE DRAWINGS

FIG. 4 is a circuit diagram of a sense amplifier according to an embodiment of the present invention; and FIGS. 5 and 6 are circuit diagrams of sense amplifiers according to other embodiments of the present invention.

DETAILED DESCRIPTION OF THE PREFERRED EMBODIMENTS

Preferred embodiments of the present invention will be described with reference to the accompanying drawings.

In an embodiment shown in FIG. 4, a pair of N channel MOS transistors Q1 and Q2 serve as amplifying transistors to constitute a differential amplifier. A pair of P channel MOS transistors Q3 and Q4 serve as load elements to constitute a current-mirror circuit. N channel MOS transistor Q7 serves as a switching transistor, the gate of which receives an enable signal SAE to cause the sense amplifier to operate. A pair of P channel MOS transistors Q8 and Q9 constitute a pull-up circuit.

The sources of transistors Q1 and Q2 are connected to low power source potential VSS, e.g., ground potential through the drain-source path of transistor Q7. The gates of transistors Q1 and Q2 receive a pair of differential input signals $\overline{\text{IN}}$ and IN through input signal lines 1 and 2, respectively.

The drains of transistors Q3 and Q4 are connected to drains of transistors Q1 and Q2, respectively. The drain of transistor Q3 is also connected to its gate. The sources of transistors Q3 and Q4 are connected to high power source potential VDD. The gates of transistors Q3 and Q4 are interconnected. Junction N1 between transistors Q1 and Q3 is connected to output signal line 3 for extracting output signal OUT. Junction N2 between transistors Q2 and Q4 is connected to output signal line 4 for extracting output signal $\overline{\text{OUT}}$.

The sources of transistors Q8 and Q9 are connected to power source potential VDD. The drain of transistor Q8 is connected to output line 3, and the drain of transistor Q9 is connected to output line 4. The gate of transistor Q8 is connected to output line 4, and the gate of transistor Q9 is connected to output line 3.

Figure 3:
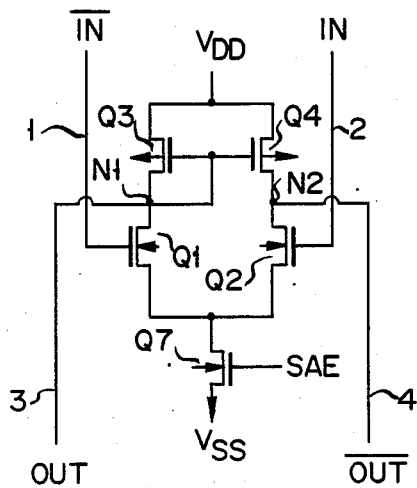

As is apparent from a comparison between the circuit of FIG. 4 and the conventional circuit of FIG. 3, the circuit of FIG. 4 is substantially the same as that of FIG. 3 except that a potential pull-up circuit is inserted between a pair of output nodes N1 and N2. The elements in FIG. 3 having the same number as in FIG. 4 denote the same elements, so as to allow easy correspondence.

In the embodiment of FIG. 4, when signal SAE is supplied to the gate of transistor Q7 to enable the sense amplifier while input signals $\overline{\text{IN}}$ and IN are respectively supplied to the gates of transistors Q1 and Q2 through input signal lines 1 and 2, the sense amplifier amplifies the potential difference therebetween. Signals OUT and $\overline{\text{OUT}}$ appear at lines 3 and 4, respectively. If signal IN is set at a lower potential than signal IN, output signal OUT is set at high level VOH and signal $\overline{\text{OUT}}$ is set at low level VOL. In this case, if a potential at output node N2 is lower than (VDD−|VTHP|), this low potential is supplied to the gate of transistor Q8 in the pull-up circuit, to turn transistor Q8 on. The potential at output node N1, connected to the drain of transistor Q8, is then increased to potential (VDD−|VTHP|) or higher. Thus, an output signal of a higher potential than that of the high potential signal in the conventional circuit can be obtained. The difference between the high and low potential signals is larger than that in the conventional circuit. Therefore, the memory operation margins for variations in power source potential and element characteristics are increased. In addition, a higher output amplitude can be obtained at high speed, so that the sensing operation can be performed at high speed.

When input signal $\overline{\text{IN}}$ is set at a lower potential than input signal IN, output node N1 is set at a higher potential than that in the conventional circuit. The drive capacity of transistors Q3 and Q4 is decreased and the capacity for increasing the potential at node N2 is also decreased accordingly. Therefore, the potential at output node N2 can be set at lower potential VOL than that in the conventional circuit. For this reason, the output amplitude can be greater than that in the conventional circuit.

The present invention is not limited to the particular embodiment described above. The arrangements shown in FIG. 5 or 6 can also be used.

The arrangement in FIG. 5 is substantially the same as that in FIG. 4, except that P channel transistor Q10 and inverter 6 are added. The sources of transistors Q8 and Q9 are connected to pull-up power source potential VDD through the drain-source path of transistor Q10. Inverter 6 receives the enable signal SAE and supplies inverted signal $\overline{\text{SAE}}$ of the enable signal to the gate of transistor Q10. In this embodiment, transistor Q10 is turned on in response to inverted signal $\overline{\text{SAE}}$, to connect the sources of transistors Q8 and Q9 to potential VDD. For this reason, even if potentials at output lines 3 and 4 are not in equilibrium prior to the operation of the sense amplifier, the potentials become equilibrated upon operation, thereby obtaining stable sensing. Other arrangements of the circuit in FIG. 5 are the same as those of FIG. 4, and a detailed description thereof will be omitted.

In another embodiment shown in FIG. 6, P channel transistors Q11 and Q12 and inverter 6 are added to the circuit in FIG. 4. The drain of transistor Q8 and the gate of transistor Q9 are connected to output line 3 through the drain-source path of transistor Q11. The drain of transistor Q9 and the gate of transistor Q8 are connected to output line 4 through the drain-source path of transistor Q12. The gates of transistors Q11 and Q12 are connected to the enable signal $\overline{\text{SAE}}$. Inverter 6 receives the enable signal $\overline{\text{SAE}}$ and supplies inverted signal SAE of the enable signal to the gates of transistors Q11 and Q12. In this embodiment, transistors Q11 and Q12 are turned on in response to signal SAE to respectively connect the drains of transistors Q8 and Q9 to output lines 3 and 4. Other arrangements and operation of the circuit in FIG. 6 are the same as those in FIG. 4, and detailed description thereof will be omitted. For this reason, even if potentials at output lines 3 and 4 are not in equilibrium prior to the operation of the sense amplifier, the potentials become equilibrated upon operation, thereby obtaining stable sensing.

Figure 1:
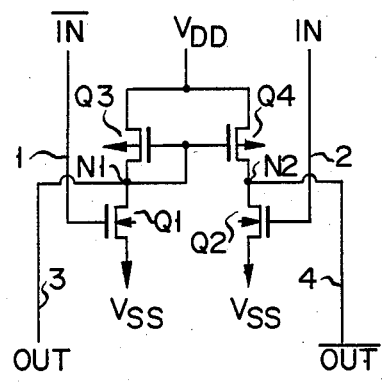
FIG. 1 is a circuit diagram of a conventional sense amplifier.
Figure 2:
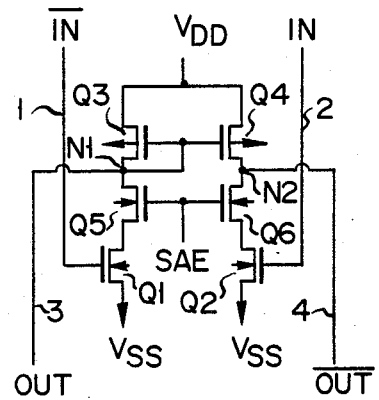
FIGS. 2 and 3 are respectively circuit diagrams of other conventional sense amplifiers.

The activation control circuit can be applied to the conventional circuits in FIGS. 1 and 2.

In each embodiment described above, transistors Q8 and Q9 are preferably the same size but are not limited thereto. The pull-up potential connected to transistors Q8 and Q9 is not limited to power source potential VDD of the sense amplifier. The pull-up potential can be replaced with a higher potential. If the pull-up potential is such a higher potential, high output potential VOH from the sense amplifier is further increased.

In each embodiment described above, N channel amplifying transistors Q1 and Q2 may be replaced with P channel transistors; P channel load transistors Q3 and Q4 with N channel transistors; and P channel pull-up transistors Q8 and Q9 with N channel transistors. In this case, high power source potential VDD and low power source potential VSS are reversed.

According to the current-mirror type sense amplifier of the present invention, the output amplitude and the memory operation margins are large and the sensing operation can be performed at high speed. Therefore, the sense amplifier can be suitably incorporated in a static RAM, a nonvolatile PROM, and the like.

What is claimed is:

1. A current-mirror type sense amplifier comprising:
   first and second input terminals;
   first and second output terminals;
   a first power source node connected to a first power source potential;
   a second power source node connected to a second power source potential;
   a pull-up node connected to a pull-up potential;
   a differential amplifier for amplifying an input signal between said first and second input terminals to create a potential difference between said first and second output terminals, said differential amplifier including first and second MOS transistors of a first conductivity type, said first MOS transistor having a gate connected to said first input terminal and a drain-source path coupled between said second power source node and said first output terminal, and said second MOS transistor having a gate connected to said second input terminal and a drain-source path coupled between said second power source node and said second output terminal;

a current-mirror type load circuit comprising third and fourth MOS transistors of a second conductivity type, said third and fourth MOS transistor having gates connected to each other and to said first output terminal, said third MOS transistor having a drain-source path coupled between said first power source node and said first output terminal, and said fourth MOS transistor having a drain-source path coupled between said first power source node and said second output terminal; and pull-up circuit means for increasing the potential difference between said output terminals, said pull-up circuit means including fifth and sixth MOS transistors of said second conductivity type, said fifth MOS transistor having a gate connected to said second output terminal and a drain-source path coupled between said pull-up node and said first output terminal, and said sixth MOS transistor having a gate connected to said first output terminal and a drain-source path coupled between said pull-up node and said second output terminal.

2. A sense amplifier according to claim 1, in which said pull-up potential is substantially the same as said first power source potential.

3. A sense amplifier according to claim 1, further comprising a seventh MOS transistor having a drain-source path connected at one end to said drain-source paths of said first and second transistors and at the other end to said second power source node, and having a gate coupled to receive an enable signal for the sense amplifier.

4. A sense amplifier according to claim 3, further comprising an eighth MOS transistor having a drain-source path connected at one end to the drain source paths of said fifth and sixth transistors and at the other end to said pull-up node, and having a gate coupled to receive an inverted signal of said enable signal.

5. A sense amplifier according to claim 3, further comprising eighth and ninth MOS transistors, said eighth transistor having a drain-source path connected between the drain source path of said fifth transistor and said first output means, and having a gate coupled to receive an inverted signal of said enable signal, and said ninth transistor having a drain-source path connected between the drain-source path of said sixth transistor and said second output means, and having a gate coupled to receive said inverted signal.

* * * * *